US007299367B2

(12) United States Patent
Hamm et al.

(10) Patent No.: US 7,299,367 B2
(45) Date of Patent: Nov. 20, 2007

(54) METHODS, SYSTEMS AND COMPUTER PROGRAM PRODUCTS FOR DEVELOPING RESOURCE MONITORING SYSTEMS FROM OBSERVATIONAL DATA

(75) Inventors: Gregory Philip Hamm, Raleigh, NC (US); John Michael Lake, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 812 days.

(21) Appl. No.: 10/703,941

(22) Filed: Nov. 7, 2003

(65) Prior Publication Data
US 2005/0102426 A1    May 12, 2005

(51) Int. Cl.
*G06F 1/24* (2006.01)

(52) U.S. Cl. .................. 713/194; 713/193; 713/166

(58) Field of Classification Search ............. 713/194, 713/166, 193
See application file for complete search history.

(56) References Cited

U.S. PATENT DOCUMENTS

| 4,719,566 A * | 1/1988 | Kelley .................. 340/5.27 |
| 4,748,668 A * | 5/1988 | Shamir et al. .......... 380/30 |
| 4,858,152 A | 8/1989 | Estes .................. 364/550 |
| 5,655,074 A | 8/1997 | Rauscher ............. 395/183.14 |
| 5,796,633 A | 8/1998 | Burgess et al. ...... 364/551.01 |
| 5,903,757 A | 5/1999 | Gretz et al. .......... 395/704 |
| 6,148,335 A | 11/2000 | Haggard et al. ...... 709/224 |
| 6,182,022 B1 | 1/2001 | Mayle et al. .......... 702/182 |
| 6,327,677 B1 | 12/2001 | Garg et al. .............. 714/37 |
| 6,516,350 B1 | 2/2003 | Lumelsky et al. ...... 709/226 |
| 6,574,587 B2 | 6/2003 | Waclawski ............. 702/186 |

OTHER PUBLICATIONS

U.S. Patent Application for *Methods and Apparatus for Performance Management Using Self-Adjusting Model-Based Policies*, filed Sep. 30, 1999.
U.S. Patent Application for *Method, System and Program Product for Managing Network Performance*, filed Apr. 11, 2000.
Irvin, DR Moore, RE, *Hybrid Dual Threshold Algorithm for Managing Link Performance Counters*, TDB n 1 a Jun. 1992 p. 152-156.

* cited by examiner

*Primary Examiner*—Thomas R. Peeso
(74) *Attorney, Agent, or Firm*—David Irvin; Myers Bigel Sibley & Sajovec

(57) ABSTRACT

Methods, systems and computer program products for of selecting an alert condition for a resource monitoring system are provided in which a logic value is associated with at least some entries in a database. The entries in the database may correspond to values for specified metrics at different times. The alert condition is selected based on the logic values and the entries in the database.

24 Claims, 3 Drawing Sheets

METHODS, SYSTEMS AND COMPUTER PROGRAM PRODUCTS FOR DEVELOPING RESOURCE MONITORING SYSTEMS FROM OBSERVATIONAL DATA

FIELD OF THE INVENTION

The present invention relates to resource monitoring systems and, more particularly, to methods, systems and computer program products that may be used to develop resource monitoring systems.

BACKGROUND OF THE INVENTION

Resource monitoring systems refer to systems that monitor other systems for situations that may require corrective action. A resource monitoring system typically includes a collection of rules that determines under what situations corrective action should be initiated and the type of corrective action to apply in a particular situation. When a resource monitoring system detects such a situation, the resource monitoring system may, for example, alert an operator and/or self-initiate corrective procedures. Resource monitoring systems are used to monitor a wide variety of software and hardware systems such as computers, applications programs, servers, and industrial systems and equipment, and may greatly expand the number of different systems and applications that an operator may be able to effectively manage.

Typically, resource monitoring systems operate at least in part by (1) extracting raw statistics (data) at specified time intervals from the application or system that is being monitored, (2) processing those statistics, and (3) alerting operators and/or taking corrective action when the processing logic determines a condition requiring the operator's attention and/or automatic correction (an "alert condition") has occurred. Resource monitoring systems may generally be classified into one of two types, namely, instantaneous systems and persistent systems.

Instantaneous resource monitoring systems are systems that use current statistics (and, in some instances, the last prior measured statistic and the elapsed time between the current and last prior measurements) to determine whether an alert condition has occurred. In contrast, persistent systems keep track of the past k values of the measured statistics to impose a "situational persistence" requirement—i.e., a situation must occur for at least a certain amount of time before an alert is raised and/or before corrective action is taken. For example, in a persistent resource monitoring system an alert condition may only be deemed to have occurred if an instantaneous alert condition persists for at least three consecutive time intervals. More sophisticated persistent systems may look at both how many times a condition occurs and how many times it does not occur (such non-occurrences are referred to as "holes") during the past k responses, meaning that an alert is only raised when the condition persists for a certain number of occurrences with no more than another number of non-occurrences during the specified interval. Thus, for example, a persistent resource monitoring system may specify that an alert condition is only deemed to have occurred if the instantaneous alert condition persists for at least ten time intervals with no more than 2 non-occurrences or "holes" occurring during that time interval. Alternatively, a persistent resource monitoring system may specify that an alert condition is only deemed to have occurred if the instantaneous alert condition appears ten times, with no more than 2 non-occurrences or "holes" between each alert condition.

Unfortunately, resource monitoring systems typically are very labor-intensive to construct and test. The difficulties associated with generating such models serves to severely limit their application, in terms of both resource monitoring systems that are developed and provided by outside vendors and ad hoc end-user constructed resource monitoring systems that are designed to detect specific alertable conditions.

SUMMARY OF THE INVENTION

Embodiments of the present invention provide methods of selecting an alert condition for a resource monitoring system. Pursuant to these methods, a logic value is associated with at least some of the entries in a database, where the entries in the database are values for a group of metrics taken at different times. The alert condition is then selected based on at least some of the logic values and at least some of the entries in the database. In these methods, the act of selecting the alert condition may be accomplished, for at least one of the metrics, by using the logic values and the entries in the database to determine a feasible range of values for a threshold, where the threshold will have a specified relationship with respect to the metric. The alert condition may then be selected based on the determined feasible ranges of values. In these methods, the specified relationship may be that the metric will be less than or equal to the threshold and/or that the metric will be greater than or equal to the threshold.

In embodiments of the present invention, the group of metrics may include one or more of the following metrics: (a) a raw metric, (b) a derived metric that is calculated as the difference between the value of a raw metric at a first time and the value of the raw metric at a second time, (c) a derived metric that is calculated as the difference between the value of a first raw metric at a first time and the value of the first raw metric at a second time divided by the interval between the first time and the second time, and/or (d) a derived metric that is calculated as the difference between the value of a first raw metric at a first time and the value of the first raw metric at a second time divided by the difference between the value of a second raw metric at the first time and the value of the second raw metric at the second time.

In the above-described methods, the logic values associated with entries in the database may be selected based on log entries from the resource that is to be monitored. The logic values that are specified may be specified using three-valued logic. The methods may further include specifying allowable rates of false positives, and false negatives for the resource monitoring system and/or a maximum amount of time that may elapse before an alert is generated after the occurrence of a potential alert condition system. The methods may also include using historical metric data to estimate the number of alerts that the alert condition would generate for different potential persistence criteria, and a persistence alert condition may then be selected based on the first alert condition and one of the potential persistence criteria that satisfies the specified allowable rates of false positives and of false negatives.

Pursuant to further embodiments of the present invention, methods of generating persistent resource monitoring systems are provided. Pursuant to these methods, an instantaneous resource model having an associated alert condition is provided and allowable rates of false positives and false negatives for the persistent resource monitoring system are specified. A database of historical information is then processed to determine the number of times that the persistent resource monitoring system would take corrective action for a variety of different persistence criteria. One of the persistence criteria may then be selected as the persistence requirement that is applied to the instantaneous resource model to create the persistent resource monitoring system. This may be accomplished in embodiments of the present invention by selecting the persistence criteria having a smallest duration that satisfies the allowable rate of false positives and the allowable rate of false negatives.

DETAILED DESCRIPTION

Figure 1:
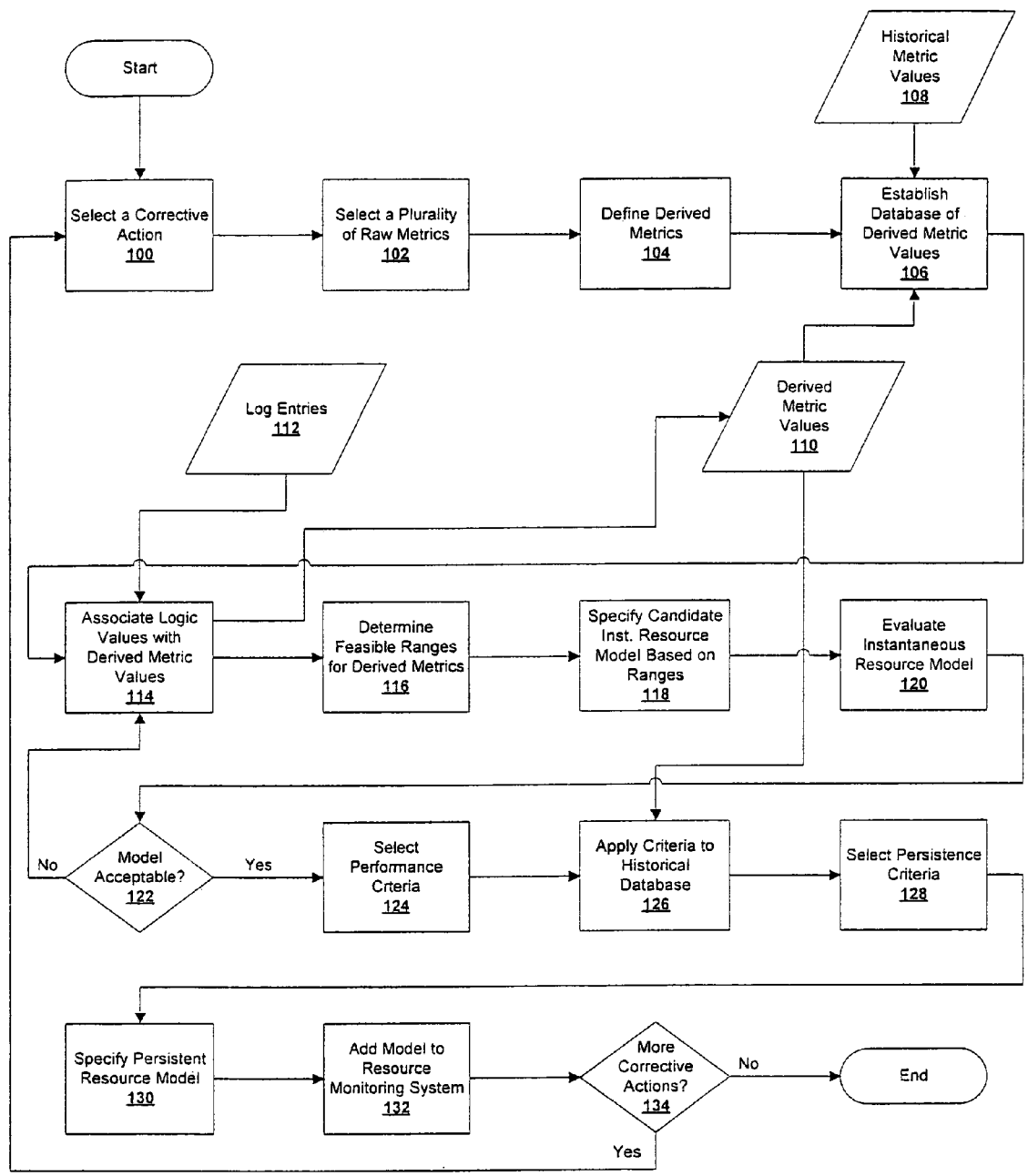
FIG. 1 is a flow chart diagram illustrating operations of methods, systems and computer program products pursuant to embodiments of the present invention.

The present invention will now be described more fully with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As will be appreciated by one of skill in the art, the present invention may be embodied as methods, data processing systems, or computer program products. Accordingly, the present invention may take the form of entirely software embodiments or embodiments combining software and hardware aspects. Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may be written in an object oriented programming language such as Java®, Smalltalk or C++ and/or using a conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention provides methods, systems and computer program products that may be used to construct resource monitoring systems based on observational data. Pursuant to certain embodiments of the present invention, machine learning/data mining methodologies may be used to search an archive of historical data to generate, and/or assess the sensitivity of, candidate resource monitoring systems. These candidate resource monitoring systems may be derived using information regarding situations where a specific corrective action was previously found to be an acceptable solution to a problem that had arisen with the system that is to be monitored. The methodologies of the present invention may be incorporated into a "design wizard" that may be used to simplify the process for creating a resource monitoring system.

In embodiments of the present invention, a plurality of raw metrics $m_i$ may be selected that are used in the development of the resource monitoring system. By "raw metrics" it is meant numerical or other parameters associated with the resource that is being monitored such as, for example, the cumulative number of page faults, the number of page faults per unit time, response times for various actions and the like. The value of these raw metrics typically vary over time. Thus, each raw metric $m_i$ may be represented by a vector $m_i(t)$, where each entry in the vector represents the measured value of $m_i$ at a specific time. The index for each metric typically will be persistent, such that if $m_i(t)$ refers to a given metric at time t, $m_i(t')$ refers to the same metric at time t', and $(m_i(t')-m_i(t))$ gives a semantically meaningful difference. As discussed herein, a historical database of values for the selected raw metrics $m_i(t)$ is used in the construction of the resource monitoring system, so typically the selected raw metrics will be metrics for which historical data is available and/or can be generated.

A predicate G may also be defined that is a function of certain metrics (either the raw metrics discussed above and/or the "derived metrics" discussed below) that are associated with the system that is to be monitored. G may have an unknown structure and may be taken as a description of the gross characteristics of the situation that the resource monitoring system is intended to detect. A predicate is a function of the identified variables that returns a truth value (e.g., TRUE or FALSE) based on the values of the identified variables. In embodiments of the present invention, the predicate may be allowed to operate in a three-valued logic domain of TRUE, FALSE and NO COMMITMENT (the value of NO COMMITMENT means that the predicate makes no commitment as to whether G is true or false in a specific situation). In embodiments of the present invention, the predicate G may be a function of one or more of the selected metrics taken at adjacent measurement times t and t'. In further embodiments of the invention, G may be a function of one or more of the selected metrics taken over a range of times or on a time-limited average.

As discussed herein, a user of the methods, systems and/or computer program products of the present invention may provide an initial theory regarding G. This initial theory acts to initialize the methodology and the methodology/system may be run iteratively until the user is satisfied with the result or the methodology/system demonstrates that no system is consistent with the user's proposed theories. By way of example, with respect to network server resources, many conditions can cause response times of the server to rise above a threshold. In the specific situation where (1) servlet response times are above a specified threshold, (2) a "large" number of sessions have been open for an "extended" time and (3) the associated Java Virtual Machine is using "minimal" CPU resources, it may be indicative of a deadlock. The appropriate response to a deadlock is to shutdown and restart the application server. The user would like to construct a resource monitoring system that identifies this situation with a minimum number of false positives (i.e., situations where the resource monitoring system identifies a deadlock as having occurred when it in fact has not occurred) and false negatives (i.e., situations where the resource monitoring system fails to identify that a deadlock has occurred). The user, who initially may only know that in the past when the response time was too high and that a restart fixed the problem may seed the methodology for constructing a resource monitoring system that will take the corrective action of restarting the system with the following initial theory of G:

$$G(m_i(t)) \text{ is TRUE if } m_i(t) > x \quad (1)$$

where $m_i(t)$ is the servlet response time and x is a value such as, for example, 180 seconds, that is supplied by the user. As discussed herein, this initial theory of G may be used to classify specific observations from an historical database of data into positive (i.e., TRUE), negative (i.e., FALSE) and indeterminate (i.e., NO COMMITMENT) examples.

In embodiments of the present invention, the following logical atoms may be defined:

$$\text{METRIC} \leq \text{THRESHOLD OR} \quad (2)$$

$$\text{METRIC} \geq \text{THRESHOLD}, \quad (3)$$

where METRIC is a metric that is used in the resource monitoring system and THRESHOLD is an unknown threshold value. One or more of the raw metrics $m_i(t)$ may be used for METRIC. Alternatively, one or more derived metrics $D_k(m_i)$ may be used for METRIC, where a "derived metric" refers to a metric that is calculated based on the values of one or more of the raw metrics. The notation $D_k(m_i)$ is used herein to represent the $k^{th}$ derived metric that is based on raw metric $m_i(t)$. Also note that derived metric $D_k(m_i)$ may be a vector having values for different points in time, although to simplify the notation, the term $m_i(t)$ has been shortened to $m_i$. The use of derived metrics may, in certain situations, provide more and/or better information regarding when a particular resource that is being monitored has reached a point that some sort of corrective action may be beneficial. In embodiments of the present invention, one or more of the following derived metrics may be used in the construction of resource monitoring systems:

$$D_1(m_i) = m_i(t) \quad (4)$$

$$D_2(m_i) = m_i(t) - m_i(t') \quad (5)$$

$$D_3(m_i) = [m_i(t) - m_i(t')]/dt \quad (6)$$

$$D_4(m_i) = [m_i(t) - m_i(t')]/[m_j(t) - m_j(t')] \quad (7)$$

In Equations 4-7 t and t' are adjacent times in the database of raw metric values and division by zero is not implied. Note also that the "derived metric" $D_1(m_i)$ is not a derived metric at all, but instead is simply the raw metric $m_i(t)$. Note further that the derived metric $D_4(m_i)$ may be calculated for as many different combinations of first raw metrics $m_i(t)$ and second raw metrics $m_j(t)$ as is desired. It will also be appreciated that the invention is not limited to using some or all of the exemplary derived metrics set forth in Equations 4-7. For example, as discussed above, derived metrics at time t can include functions of many metrics taken over a range of times.

As noted above, a historical database of values for the raw metrics $m_i(t)$ is available or generated for use in the methods, systems and computer program products of the present invention. By "database" it is meant a collection of data stored in any form, including data stored, for example, in a table or a file on a data processing system. Thus, the term "database" is used broadly herein and is not limited to data that is stored in or used with, for example, a conventional database program such as a relational database. In embodiments of the invention in which derived metrics are used, a database of derived metric values may be constructed using the historical database of values for the raw metrics $m_i(t)$ and the equations (e.g., Equations 4-7 above) that define each of the derived metrics.

A logic value may be associated with at least some of the entries in the database of metric values (this may be either the historical database of raw metric values of the database of derived metric values depending upon which type of metric is used in any particular implementation). In embodiments of the present invention, a three valued logic system may be used where the logic values may be TRUE, FALSE or NO COMMITMENT. A logic value of NO COMMITMENT may be the default when no logic value is associated with entries in the database of metric values. Typically, the same logic value will be associated with all of the derived metrics associated with a particular time $t_1$. However, this need not be the case.

Continuing with the example set forth above, the user seeds the methodology by initially proposing the theory that $G(m_1(t))$ is TRUE if $m_1(t) > x$ where $x = 180$ and $m_1(t)$ is the raw metric for servlet response time. Based on this initial theory, entries in the historical database having a servlet response time that exceeds 180 are classified as TRUE (i.e., the logical value TRUE is associated with those entries in the database). The user may choose to classify additional entries in the database as FALSE, and may make no commitment with respect to other entries. In many instances, logic values of TRUE or FALSE will only be associated with a relatively small percentage of the entries in the database.

A "situational description" algorithm may be executed to determine feasible threshold settings, if any, for which the logical atoms METRIC≤THRESHOLD and METRIC≥THRESHOLD hold true. An interval [a, b] may be defined that represents the lower and upper endpoints, respectively, of the set of feasible threshold values for which a particular metric (e.g., $m_1(t)$ or $D_2(m_3)$) is less than or equal to the threshold. Likewise, a second interval [c, d] may be defined that represents the lower and upper endpoints, respectively, of the set of feasible threshold values for which the metric at issue is greater than or equal to the threshold.

The "situational description" algorithm starts with the lower endpoints "a" and "c" of the two feasible ranges of threshold settings initialized to the lowest possible value that they can attain (e.g., negative infinity, 0, etc., depending upon what the metric is and the lowest value that it can attain) and with the upper endpoints "b" and "d" of the two feasible ranges of threshold settings initialized to the highest possible value that they can attain (e.g., infinity, $2^{31}-1$, etc.). The "situational description" algorithm then uses the information from the historical database (i.e., the database of raw metrics or the database of derived metrics depending upon the type of metric at issue) to move the endpoints of each range [a, b] and [c, d] closer together by using the information provided by the user about G to classify additional data in the database into positive (TRUE) or negative (FALSE) examples. In certain embodiments of the present invention this may be accomplished as described below.

After initializing the endpoints of the ranges as discussed above, the relevant database of historical information is examined to identify each entry for the metric at issue that has been associated with a logical value of TRUE or a logical value of FALSE (entries with a logical value of NO COMMITMENT may be ignored). Where a logical value of TRUE has been associated with a particular entry for one of the metrics in the database, endpoint "a" of the first range is recalculated as the greater of "a" or the value of the particular entry for the metric ("theta") in the database. In this situation endpoint "b" retains its previous value. Where a logical value of FALSE has been associated with a particular entry for the metric in the database, endpoint "a" retains its previous value and endpoint "b" is recalculated as the lesser of "b" and theta. Likewise, where a logical value of TRUE has been associated with a particular entry the metric in the database, endpoint "c" retains its previous value and endpoint "d" is recalculated as the lesser of "d" and theta. Where a logical value of FALSE has been associated with a particular entry for the metric in the database, endpoint "c" is recalculated as the greater of "c" and theta and endpoint "d" retains its previous value. The output of this algorithm is a table of five-tuples <METRIC, a, b, c, d>, where one such five-tuple exists for each metric (e.g., $D_k(m_i)$) that is processed using the situational description algorithm. Table 1 summarizes the processing steps that comprise the situational description algorithm:

TABLE 1

| Disjunct | Positive (TRUE) Example | Negative (False) Example |
| --- | --- | --- |
| METRIC ≤ THRESHOLD | [a, b] = [max(a, theta), b] | [a, b] = [a, min(b, theta)] |
| METRIC ≥ THRESHOLD | [c, d] = [c, min(d, theta)] | [c, d] = [max(c, theta), d] |

In embodiments of the present invention, the list of five-tuples <METRIC, a, b, c, d> that are generated via the processing steps of Table 1 may be used to construct an instantaneous resource monitoring system. The condition that gives rise to an alert condition is called "COND." COND may be initialized to a value of "TRUE." The equation for COND may then be further constructed using the five-tuples <METRIC, a, b, c, d> as follows. For each five-tuple<METRIC, a, b, c, d>:

if ($a>b$) and ($c>d$), COND remains unchanged (8)

if ($a<b$) and ($c<d$), METRIC≤a and METRIC≥c is appended to COND (9)

if ($a<b$) and ($c>d$), METRIC≤a is appended to COND (10)

if ($a>b$) and ($c<d$), METRIC≥c is appended to COND (11)

The processing of each of the five-tuples <METRIC, a, b, c, d> using Equations 8-11 provides the mathematical expression of the complete function that comprises a candidate instantaneous resource monitoring system. This candidate instantaneous resource monitoring system may then be evaluated and refined, used to develop a candidate persistent resource monitoring system and/or used to monitor the resource that is to be monitored.

Various embodiments of the present invention will now be described with reference to the figures. FIG. 1 is a flow chart diagram that illustrates operations according to embodiments of the present invention that may be used to develop resource monitoring systems. As shown in FIG. 1, the operations may start with the selection of a particular corrective action that the resource monitoring system is to perform (block 100). By way of example, corrective actions that could be specified might include alerting an operator, notifying a user of the resource, shutting down the resource (and perhaps thereafter restarting it) and/or shutting down related systems, applications and/or resources. The particular type of corrective action may be defined by, for example, the designer of the instantaneous resource monitoring system. As shown in FIG. 1, resource monitoring systems generated according to certain embodiments of the present invention may be designed to implement more than one corrective action where the corrective action taken will vary depending upon the values of various system parameters (i.e., metrics) that are monitored by the resource monitoring system.

Next, a plurality of raw metrics $m_i(t)$ may be selected that are used by the resource monitoring system (block 102). As discussed above, embodiments of the present invention may use raw metrics and/or derived metrics in the construction of the resource monitoring system (a "derived metric" is a metric that is calculated based on the values of one or more of the raw metrics). In the embodiments of the present invention illustrated in FIG. 1, a plurality of derived metrics are used. As shown in FIG. 1, after selection of the raw metrics $m_i(t)$ operations continue at block 104 with the definition of the derived metrics $D_k(m_i)$ that are to be used in the construction of the resource monitoring system. In embodiments of the present invention, a system or computer program product that is used in the construction of the resource monitoring systems may define the derived metrics that are to be used (either by using pre-assigned derived networks or by adaptively selecting the derived metrics that are to be used based on information regarding the system that is to be monitored) or, alternatively the derived metrics that are used may be defined by the user/operator of the system. Equations 4-7 above provide examples of the types of derived metrics that might be used in the methods, systems and computer program products of the present invention.

Typically, a historical database of values for the raw metrics (database 108) will already be in existence with respect to the resource that is to be monitored, although such a database may also be specially constructed for use in the methods, systems and computer program products of the present invention. In embodiments of the present invention where derived metrics are used, at block 106 of FIG. 1 a database of derived metric values (database 110) may be established. This may be accomplished, for example, by taking data from the historical database of values for the raw metrics $m_i(t)$ (database 108) and using that data in the equations that define the selected derived metrics $D_k(m_i)$ to compute historical values for the derived metrics. It will be appreciated, however, that a historical database of values for the derived metrics need not be compiled, as the values of the derived metrics may be computed directly from the raw metric data on an as needed basis.

As shown at block 114 of FIG. 1, a logic value may be associated with at least some of the entries in the database of derived metric values (database 110). In embodiments of the present invention, the logic values that are associated with entries in the database of derived metric values (database 110) may be provided by the user of the methods, systems and computer program products of the present invention. Such a user might, for example, look at log entries (each of which may have a time stamp) made during previous operation of the resource that is to be monitored to identify error codes or other information that may be useful in developing a resource monitoring system. These log entries may be contained in a log file 112 or may be obtained from a variety of other sources. By way of example, the user might specify as TRUE all of the values in the derived metric database that are within 2 minutes of a time at which a log entry of "Error Code=237" was recorded in the log file 112. The user might also specify that all of the derived metrics at the time of a log entry of "Code Restart" are FALSE. More sophisticated criteria may be used for associating logical values with entries in the database 110 of derived metric values such as, for example, associating values based on the manner in which two different log entries interact. Derived metrics which are not associated with a logic value of TRUE or FALSE may be assigned a logic value of NO COMMITMENT. It will also be appreciated by persons of skill in the art that the association of logic values with entries in the historical databases may be automated in embodiments of the present invention.

Operations continue in the flow chart of FIG. 1 at block 116 with the determination of feasible ranges of values for a threshold such that the threshold will have a specified relationship with respect to one of the derived metrics. In particular, in the embodiments of the invention illustrated in FIG. 1, for each derived metric $D_k(m_i)$ the operations of block 116 determine an interval [a, b] that represents the feasible range, if any, for a threshold such that the logical atom $D_k(m_i) \leq$ THRESHOLD will be TRUE. The operations at block 116 likewise determine for each derived metric $D_k(m_i)$ an interval [c, d] that represents the feasible range, if any, for a threshold such that the logical atom $D_k(m_i) \geq$ THRESHOLD will be TRUE. It will be appreciated that the system could be designed to operate with other logical atoms. As discussed above, the situational description algorithm set forth in Table 1 may be used to determine the intervals [a, b] and [c, d].

Although not depicted in FIG. 1, after the feasible ranges are determined for each of the derived metrics $D_k(m_i)$, the user may choose to evaluate the output of the situational description algorithm and, if necessary, modify some of the input information such as the logic values associated with specific entries in the historical database 110 of derived metric values and/or the derived metrics that are used. Such an evaluation step may facilitate efficient construction of the resource monitoring system, particularly in situations where the situational description algorithm indicates that with respect to a particular derived metric $D_k(m_i)$ that (a>b) and that (c>d), indicating that for metric $D_k(m_i)$ there are no feasible threshold ranges that will render either of the logical atoms TRUE. Additionally, even in situations where feasible ranges are identified, it may be helpful to the design process to apply the identified range to the historical database to determine how many additional NO COMMITMENT entries in the database the identified range will move to a TRUE or FALSE setting.

Next, at block 118 of FIG. 1, a candidate instantaneous resource monitoring system may be constructed based on the identified feasible ranges for threshold values (i.e., the five-tuples <$D_k(m_i)$, a, b, c, d>). This may be accomplished by performing the instantaneous resource monitoring system construction operations specified above at Equations 8-11 to arrive at the condition COND that will be used to identify when an alert condition has arisen. A designer may then (optionally) choose to evaluate the candidate resource monitoring system (block 120). In certain embodiments of the present invention, this evaluation may be accomplished by using data from the historical database 108 of raw metric values and/or the database 110 of derived metric values to identify the situations where the candidate resource monitoring system would have generated an alert condition. The designer may then compare this information to a log file or other information regarding the operation of the resource at the time the values in the historical database 108 were generated to determine how effective the candidate resource model was in correctly identifying situations in which alerts should have been raised. This may be done, for example, by evaluating the number of false positives (situations where an alert would have been raised even though there was no actual problem) or the number of false negatives (situations when an alert should have been raised but would not have been raised by the candidate resource monitoring system) that would have occurred had the candidate resource monitoring system been in use. (Note that the specific instantaneous resource model described above will only generate false positives because the condition COND that represents the instantaneous resource monitoring system was initialized as TRUE—however, other implementations that will result in the generation of false negatives are also within the scope of the present invention.)

If, at block 122 of FIG. 1, the candidate resource monitoring system is not deemed acceptable, operations may continue by revising some of the information used to generate the model. As shown in FIG. 1, one such revision may be to change some of the logic values that are associated with the data in the database 110 of derived metric values (block 14). This may be done, for example, by making TRUE or FALSE commitments on more or less entries in the database. Additional potential revisions (not illustrated in FIG. 1) would be to modify the selection of raw metrics and/or the selection of derived metrics that were used to construct the candidate resource monitoring system and/or to modify the corrective action that is taken by the resource monitoring system.

If, at block 122, the candidate model is deemed acceptable, an instantaneous resource monitoring system is provided. This model may be used to monitor a system and/or to develop further resource monitoring systems. One way to develop a more sophisticated resource monitoring system is to expand the system to include more corrective actions. This may be accomplished, for example, by selecting one or more additional corrective actions at block 100 and then using the methodology illustrated in FIG. 1 and described herein to generate the conditions COND under which the resource monitoring system will implement these additional corrective actions.

Additional operations for creating a resource monitoring system according to further embodiments of the present invention are illustrated in blocks 124, 126, 128, 130, 132, 134 of FIG. 1. The operations set forth in these blocks of FIG. 1 may be used to take the instantaneous resource monitoring system generated at block 122 and use it to generate a persistent resource monitoring system.

As shown in FIG. 1, generation of the persistent resource model starts at block 124 with the provision of several input criteria, namely (1) the required "responsiveness" for the model, (2) a maximum acceptable level of false positive alerts generated by the resource monitoring system and (3) a maximum acceptable level of false negative alerts generated by the resource monitoring system. The "responsiveness" refers to the maximum amount of time that may elapse before the resource monitoring system implements the specified corrective action. Thus, the responsiveness criteria acts to limit the amount of "history" that the resource monitoring system may evaluate in determining whether or not to raise an alert in a particular situation. For example, if the responsiveness is specified as 10 minutes and the sampling interval (i.e., the time interval at which measurements of the raw metrics are taken) is 30 seconds, the maximum amount of history that may be considered is 600/30+1=21 time intervals worth of raw metric data. As will be appreciated by those of skill in the art, typically increasing the amount of history considered by the persistent resource monitoring system increases the systems capability to accurately identify alert situations. However, increasing the amount of history considered also decreases the responsiveness of the system as an alert (typically) is not issued until the specified amount of history has been considered.

Next, as illustrated at block 126 of FIG. 1, the condition COND generated at block 120 of FIG. 1 may be applied to the database 110 of derived metric values. At each time entry (sample) in the database 110, the condition COND either will or will not be met. If the condition COND is met, this represents an "occurrence", meaning that it is a situation where the instantaneous resource monitoring system generated at block 120 would recognize as an "alert condition" and take corrective action. A field may be added to the database 110 recording whether or not the condition COND is met for each time entry in the database. This information may then be used to generate a table that lists the number of alerts that would be generated at all feasible combinations of occurrences (and acceptable number of holes) and holes for the specified responsiveness criteria. An exemplary technique for selecting the occurrences and holes settings operates by constructing a table of the following form:

TABLE 2

Analysis of Model at Persistence Criteria Requiring 3 Interval Persistence

| (occ, holes) Setting | Alert Conditions | False Positives | Maximum False Negatives | | | | | |
|---|---|---|---|---|---|---|---|---|
| | | | 0 | 1 | 2 | 3 | 4 | 5 |
| (1, 0) | 3 | 2 | 0 | 0 | 0 | 0 | 0 | 0 |
| (3, 0) | 1 | 0 | 2 | 2 | 3 | 3 | 3 | 3 |

The entries in Table 2 are shown against an example history comprised of the raw occurrences:

++---+--+++------

In this, a '+' indicates an interval during which COND was met; a '−', not met. Analysis of this history with an (occurrences, holes) setting of (1,0) would generate 3 contiguous alert condition intervals; similarly, a setting of (2,0) would generate 2 contiguous alert condition intervals. With a persistence criteria requiring the alert condition to be at least 3 intervals in length, these alert conditions would be false positives (not meeting the persistence criteria) in all but the last contiguous interval. The "Maximum False Negative" columns are filled in by computing the number of raw occurrences that are not "claimed" by a contiguous alert interval taken against a proxy standard, those that would be claimed with a (2,i) interval setting. Each entry of the Maximum False Negatives sub-table corresponds to the count of unclaimed raw occurrences at setting (x,y) taken against the (2,i) standard. For example, the output of a persistence algorithm against the above history would be:

```
Raw:    + + − − − + − − + + + + − − − − − −
(2, 0): + + − − − − − − + + + + − − − − − −
(2, 1): + + − − − − − − + + + + − − − − − −
(2, 2): + + − − − + + + + + + + − − − − − −
(3, 0): − − − − − − − + + + + − − − − − −
```

The (2,2) setting picks up the raw occurrence at the sixth time interval that is missed by the (3,0) setting, indicating that a false negative might exist at position 6 under a (3,0) setting. (The use of the (2,i) standard is motivated by the fact that persistence requires at least two occurrences, a first and a last, separated by some number of occurrences and/or holes. Analysis against this standard gives the maximum number of indications that could have been raised.) Each entry in the Maximum False Negatives subtable can be computed by counting the number of intervals for which the raw and (2,i) standards both have '+' and the analyzed setting's interval contains '−'. This analysis can be refined by many additional techniques: for example, one could determine the maximum number of justifiable positives at a given responsiveness by processing the output of the persistence algorithm to eliminate the false positives.

Based on the analysis at block 126, a particular persistence criteria may be selected (block 128). The persistent resource monitoring system associated with the corrective action identified at block 100 is then added as part of the overall persistent resource monitoring system (blocks 130 and 132). If additional corrective actions are to be added to the system (block 134), operations may start again at block 100 with the new corrective action. Once no more corrective actions need to be added, the persistent resource monitoring system is completed.

It will be appreciated by those of skill in the art that the operations depicted in FIG. 1 need not necessarily be performed in the order illustrated in FIG. 1, and that all of the illustrated operations need not be performed. As such, FIG. 1 is not intended to limit the present invention in terms of either the operations that are performed or the order in which such operations are carried out.

Figure 2:
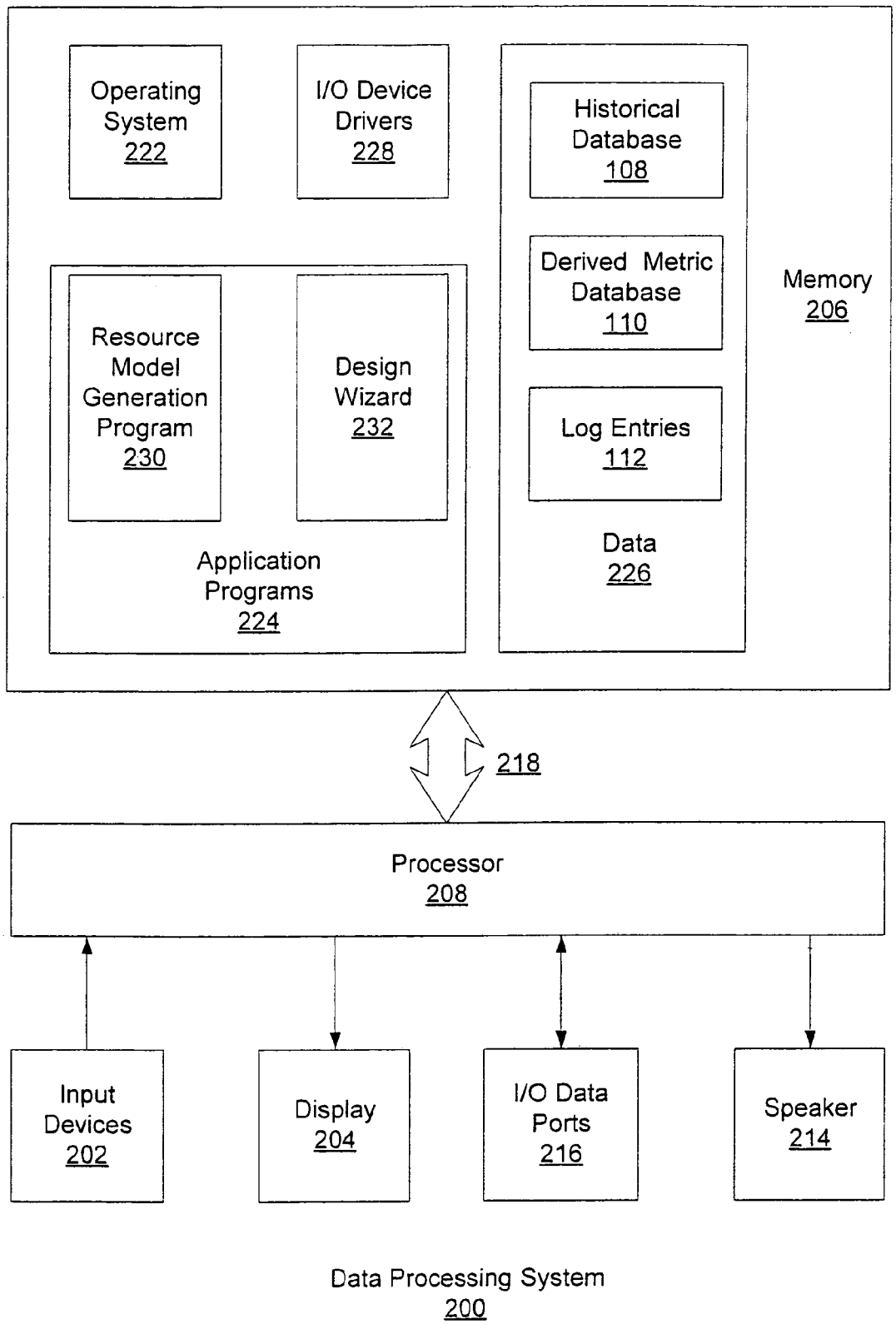
FIG. 2 is a block diagram of data processing systems that may used to implement embodiments of the present invention.

FIG. 2 is a block diagram illustrating data processing systems, methods and computer program products 200 in accordance with embodiments of the present invention. The data processing system 200 typically includes input device(s) 202 such as a keyboard or keypad, a display 204, and a memory 206 that communicate with a processor 208 via an address/data bus 218. The processor 208 can be any commercially available or custom microprocessor. The data processing system 200 may further include a speaker 214, and I/O data ports 216 that also communicate with the processor 208. The I/O data ports 216 can be used to transfer information between the data processing system 200 and another computer system or a network. These components may be conventional components, such as those used in many conventional data processing systems, which may be configured to operate as described herein.

The memory 206 is representative of the overall hierarchy of memory devices containing the software and data used to implement the functionality of the data processing system 200. The memory 206 can include, but is not limited to, the following types of devices: cache, ROM, PROM, EPROM, EEPROM, flash memory, SRAM, and DRAM. As shown in FIG. 2, the memory 206 may include several categories of software and data used in the data processing system 200: an operating system 222; application programs 224; input/output (I/O) device drivers 228; and data 226. As will be appreciated by those of skill in the art, the operating system 222 may be any operating system suitable for use with a data processing system, such as OS/2, AIX, System390 or Z/OS from International Business Machines Corporation, Armonk, N.Y., Windows95, Windows98, Windows2000 or WindowsXP from Microsoft Corporation, Redmond, Wash., Unix or Linux. The I/O device drivers 228 typically include software routines accessed through the operating system 222 by the application programs 224 to communicate with devices such as the I/O data port(s) 216 and certain memory 206 components. The application programs 224 are illustrative of the programs that implement the various features of the data processing system 200 and preferably include at least one application which supports operations according to embodiments of the present invention. Finally, the data 226 represents the static and dynamic data used by the application programs 224, the operating system 222, the I/O device drivers 228, and other software programs that may reside in the memory 206.

As is further seen in FIG. 2, the application programs 224 may include a resource model generation program 230 and a design wizard 232. The resource model generation program 230 may be a custom application that performs the operations described herein for generating a resource monitoring system. The design wizard 232, if included, may provide an interface that facilitates obtaining information from a designer and/or user that is used in generating and evaluating candidate resource monitoring systems. The design wizard 232 may also be implemented as part of the resource model generation program 230 or may be omitted altogether.

The data portion 226 of memory 206, as shown in the embodiments of FIG. 2, may include a historical database of raw metric data 108. The data portion 226 of memory 206 may further include a database of derived metric values 110, and may also include log entries 112. The data portion 226 of memory 206 may further include various other data sets (not shown in FIG. 2), such as a table recording the number of alerts that would be generated for all of the feasible combinations of occurrences and holes with respect to a candidate resource monitoring system and/or a table identifying the false positive and false negative percentages associated with each such possible (occ, holes) combination.

While the resource model generation program 230 and the components of the data portion 226 of memory 206 are illustrated in FIG. 1 as being part of a single data processing system 200, as will be appreciated by those of skill in the art, the illustrated functionality and data may be distributed across one or more data processing systems. For example, the functionality of the resource model generation program 230 may be provided on one or more data processing systems that are separate from the data processing system that includes the data 226. It will also be appreciated that various applications could be incorporated into the operating system 222 or some other logical division of the data processing system 200. Thus, the present invention should not be construed as limited to the configuration of FIG. 2, but is intended to encompass any arrangement, division of functions between data processing systems and/or configuration capable of carrying out the operations described herein.

Figure 3:
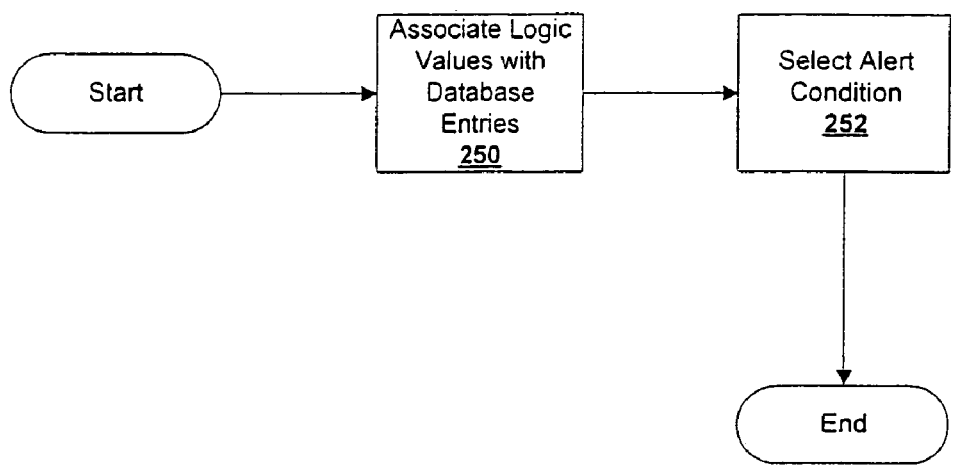
FIG. 3 is a flow chart diagram illustrating operations of methods, systems and computer program products for selecting alert conditions for resource monitoring systems according to further embodiments of the present invention.

FIG. 3 illustrates operations for selecting an alert condition for a resource monitoring system pursuant to additional embodiments of the present invention. As shown in FIG. 3, operations start by associating a logic value with at least some of a group of entries in a database (block 250). The entries in the database correspond to values for a plurality of metrics. As discussed above, this database may comprise values for raw metrics and/or derived metrics as a function of time. An existing database may be used, or the database may be independently created. Next, the alert condition may be selected based on at least some of the logic values and at least some of the entries in the database (block 252). In embodiments of the present invention, the operations of block 252 may comprise using the logic values and the entries in the database to determine, for at least some of the metrics, a feasible range of values for a threshold such that the threshold will have a specified relationship with respect to the metric, and then selecting the alert condition based on the determined feasible ranges of values.

Figure 4:
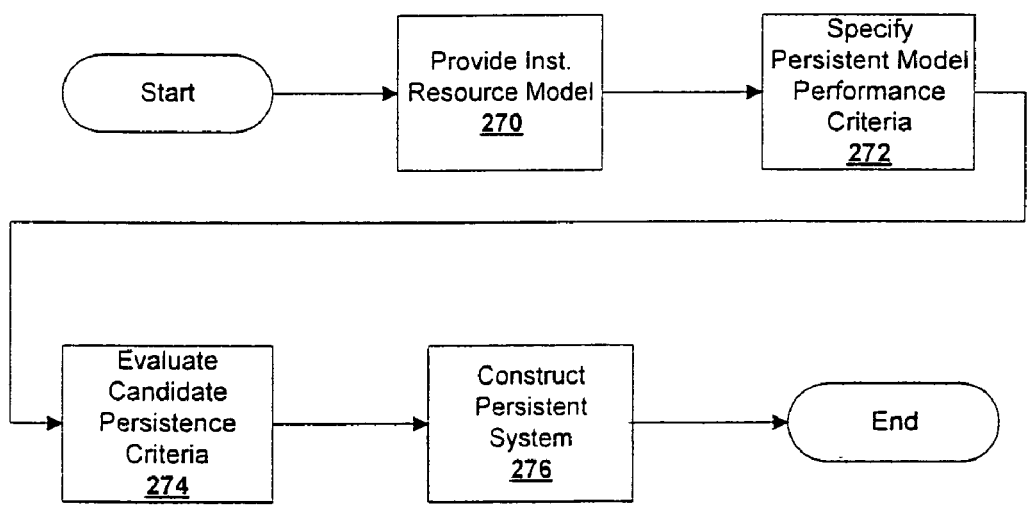
FIG. 4 is a flow chart diagram illustrating operations of methods, systems and computer program products for constructing persistent resource monitoring systems according to additional embodiments of the present invention.

FIG. 4 illustrates operations for generating persistent resource monitoring systems according to embodiments of the present invention. Operations start with the provision of an instantaneous resource monitoring system that has an associated alert condition (block 270). This instantaneous resource monitoring system may, for example, be a pre-existing resource monitoring system or a system that was developed as described herein. Operations continue in FIG. 4 with the specification of (1) an allowable rate of false positives and (2) an allowable rate of false negatives for the resource monitoring system (block 272). These allowable rates need not necessarily be absolute rates, but instead may represent "expected" maximum rates for false positives and false negative under normal operating conditions. Candidate persistence criteria may then be evaluated (block 274). This may be done, for example, by processing a database of historical information to estimate the number of times that the instantaneous resource monitoring system would take corrective action if applied for a plurality of different persistence criteria (i.e., different combinations of occurrences and holes) (block 274). Finally, one of the plurality of persistence criteria may be selected as the persistence requirement that is applied to the instantaneous resource monitoring system to create the persistent resource monitoring system (block 276). This may be done, for example, by selecting a persistence criteria that achieves the specified false positive and false negative criteria (and, optionally, any responsiveness criteria). If multiple persistence criteria meet the false positive and false negative criteria, the persistence criteria that meets the false positive and false negative criteria and has the smallest time interval may be selected.

EXAMPLE

The following example illustrates how a persistent resource monitoring system may be developed according to certain embodiments of the present invention. It will be appreciated, however, that this example is for illustrative purposes only, and is not intended to limit the invention in any way. Also note that the metric values presented in the example are arbitrary, having been randomly chosen for illustrative purposes only, and that the various tables have been simplified to facilitate explanation of this particular example.

First, a particular corrective action may be selected that the resource monitoring system is to implement. The selected corrective action might be, for example, alerting a system operator. Next, a plurality of raw metrics $m_1(t)$, $m_2(t)$, ... $m_n(t)$ are selected that will be monitored by the resource monitoring system. Typically, raw metrics will be selected that are believed to be good indicators of the situations which the resource monitoring system is attempting to detect. The raw metrics selected may, but need not, vary with respect to the particular corrective action selected. Typically, information is available in a historical database as to the values of at least some of the selected raw metrics during previous operation of the resource. An exemplary historical database containing such information is depicted in Table 3.

TABLE 3

| Time | Raw Metrics | | | Time |
| | $m_1(t)$ | $m_2(t)$ | ... | $m_n(t)$ | Value |
| --- | --- | --- | --- | --- | --- |
| $t_1$ | 4 | 0 | ... | 10 | 112 |
| $t_2$ | 8 | 2 | ... | 18 | 114 |
| $t_3$ | 10 | 93 | ... | 26 | 116 |
| $t_4$ | 12 | 46 | ... | 30 | 118 |
| $t_5$ | 18 | 21 | ... | 33 | 120 |

TABLE 3-continued

| Time | Raw Metrics | | | Time |
| | $m_1(t)$ | $m_2(t)$ | ... | $m_n(t)$ | Value |
| --- | --- | --- | --- | --- | --- |
| $t_6$ | 19 | 36 | ... | 10 | 122 |
| $t_7$ | 24 | 62 | ... | 18 | 124 |
| $t_8$ | 25 | 103 | ... | 26 | 126 |
| $t_9$ | 32 | 20 | ... | 30 | 128 |
| $t_{10}$ | 35 | 21 | ... | 33 | 130 |

Next several derived metrics $D_1$, $D_2$, $D_3$ are selected that will be used by the resource monitoring system. The selected derived metrics are as follows:

$$D_1(m_i) = m_i(t) \tag{12}$$

$$D_2(m_i) = m_i(t) - m_i(t') \tag{13}$$

$$D_3(m_i) = [m_i(t) - m_i(t')]/dt \tag{14}$$

Next, the raw metrics from the historical database (Table 3) and the formulas for the derived metric (Equations 12-14) are used to construct a second table that converts the historical database of raw metric values into a database of derived metric values. The resulting database is depicted in Table 4.

TABLE 4

| Time | Derived Metrics | | | | | | | |
| | $D_1$ ($m_1$) | $D_2$ ($m_1$) | $D_3$ ($m_1$) | $D_1$ ($m_2$) | $D_2$ ($m_2$) | $D_3$ ($m_2$) | ... | $D_3$ ($m_n$) |
| --- | --- | --- | --- | --- | --- | --- | --- | --- |
| $t_1$ | 4 | — | — | 0 | — | — | ... | — |
| $t_2$ | 8 | 4 | 2 | 2 | 2 | 1 | ... | 4 |
| $t_3$ | 10 | 2 | 1 | 93 | 91 | 45.5 | ... | 4 |
| $t_4$ | 12 | 2 | 1 | 46 | −47 | −23.5 | ... | 2 |
| $t_5$ | 18 | 6 | 3 | 21 | −25 | −12.5 | ... | 1.5 |
| $t_6$ | 19 | 1 | 0.5 | 36 | 15 | 7.5 | ... | −11.5 |
| $t_7$ | 24 | 5 | 2.5 | 62 | 26 | 13 | ... | 4 |
| $t_8$ | 25 | 1 | 0.5 | 103 | 41 | 20.5 | ... | 4 |
| $t_9$ | 32 | 7 | 3.5 | 20 | −83 | −42.5 | ... | 2 |
| $t_{10}$ | 35 | 3 | 1.5 | 21 | 1 | 0.5 | ... | 1.5 |

Next, a logic value is associated with each of the entries in the database of derived metric values. As discussed above, the logic values may be chosen, for example, based on historical log entries that correspond to a specific problem that arose where the selected corrective action was found to have been effective in the past. As the log entries have time stamps, the log entries may be associated with specific entries in the derived metric database of Table 4 so that specific logic values can be associated with entries in the database. Table 5 illustrates exemplary logic values that might be associated with the entries in the derived metric database. As shown in Table 5, in this example all of the entries in the database for a given time value are associated with the same logic value (which simplifies the example).

TABLE 5

| Time | Derived Metrics | | | | | | | Logic Value |
|------|------|------|------|------|------|------|------|------|
| | $D_1(m_1)$ | $D_2(m_1)$ | $D_3(m_1)$ | $D_1(m_2)$ | $D_2(m_2)$ | $D_3(m_2)$ | ... $D_3(m_n)$ | |
| $t_1$ | 4 | — | — | 0 | — | — | ... — | NO COMM |
| $t_2$ | 8 | 4 | 2 | 2 | 2 | 1 | ... 4 | NO COMM |
| $t_3$ | 10 | 2 | 1 | 93 | 91 | 45.5 | ... 4 | FALSE |
| $t_4$ | 12 | 2 | 1 | 46 | −47 | −23.5 | ... 2 | NO COMM |
| $t_5$ | 18 | 6 | 3 | 21 | −25 | −12.5 | ... 1.5 | TRUE |
| $t_6$ | 19 | 1 | 0.5 | 36 | 15 | 7.5 | ... −11.5 | NO COMM |
| $t_7$ | 24 | 5 | 2.5 | 62 | 26 | 13 | ... 4 | NO COMM |
| $t_8$ | 25 | 1 | 0.5 | 103 | 35 | 17.5 | ... 4 | NO COMM |
| $t_9$ | 32 | 7 | 3.5 | 20 | −83 | −42.5 | ... 2 | NO COMM |
| $t_{10}$ | 35 | 3 | 1.5 | 21 | 1 | 0.5 | ... 1.5 | NO COMM |

Next, the processing steps set forth in Table 1 are used to process each of the entries in the historical database of derived metrics (Table 5) that have an associated logic value of TRUE or FALSE. Starting with the first derived metric, $D_1(m_1)$, Table 5 indicates that at time $t_5$, the predicate $G(D_1(m_1(t)), D_1(m_1(t')), dt)$ is TRUE and that $D_1(m_1)=18$. Likewise, Table 5 indicates that at time $t_3$, $G(D_1(m_1(t)), D_1(m_1(t')), dt)$ is FALSE and $D_1(m_1)=10$. At the remaining times, no commitment is made regarding $G(D_1(m_1(t)), D_1(m_1(t')), dt)$. Table 6 illustrates the processing of this information according to the situational description algorithm set forth in Table 1.

TABLE 6

| Processing Step | A | b | c | d |
|------|------|------|------|------|
| Initialization | 0 | $2^{31}$ | 0 | $2^{31}$ |
| G(x, y, dt) is TRUE when $D_1(m_1) = 18$ | 18 | $2^{31}$ | 0 | 18 |
| G(x, y, dt) is FALSE $D_1(m_1) = 10$ | 18 | 10 | 10 | 18 |

Thus, for derived metric $D_1(m_1)$, the algorithm of Table 1 produces the following five-tuple:

<Metric, a, b, c, d>=<$D_1(m_1)$, 18, 10, 10, 18>

Since the interval [a, b] contains no members (i.e., there are no numbers that are greater than 18 but less than 10), this portion of the five-tuple is discarded in subsequent processing steps as shown below.

Next, the second derived metric, $D_2(m_1)$, is processed in the same manner as discussed above with respect to derive metric $D_1(m_1)$. Using the database of derived metric values we find that at time $t_5$, $D_2(m_1)=18-12=6$ and that at time $t_3$, $D_2(m_1)=10-8=2$ (these are the only two times for which a logical value of TRUE or FALSE is specified). Table 7 illustrates the processing of the situational description algorithm of Table 1 with respect to derived metric $D_2(m_1)$.

TABLE 7

| Processing Step | A | b | c | d |
|------|------|------|------|------|
| Initialization | 0 | $2^{31}$ | 0 | $2^{31}$ |
| G(x, y, dt) is TRUE when $D_2(m_1) = 6$ | 6 | $2^{31}$ | 0 | 6 |
| G(x, y, dt) is FALSE $D_2(m_1) = 2$ | 6 | 2 | 2 | 6 |

Thus, for derived metric $D_2(m_1)$, the algorithm of Table 1 produces the following five-tuple:

<Metric, a, b, c, d>=<$D_2(m_1)$, 6, 2, 2, 6>

Next, the third derived metric, $D_3(m_1)$, is processed in the same manner. At time $t_5$, $D_3(m_1)=[18-12]/2=3$ and that at time $t_3$, $D_3(m_1)=[10-8]/2=1$ (once again these are the only two times for which a logical value of TRUE or FALSE is specified). Table 8 illustrates the processing of the situational description algorithm of Table 1 with respect to derived metric $D_3(m_1)$.

TABLE 8

| Processing Step | A | b | c | d |
|------|------|------|------|------|
| Initialization | 0 | $2^{31}$ | 0 | $2^{31}$ |
| G(x, y, dt) is TRUE when $D_3(m_1) = 3$ | 3 | $2^{31}$ | 0 | 3 |
| G(x, y, dt) is FALSE $D_3(m_1) = 1$ | 3 | 1 | 1 | 3 |

Thus, for derived metric $D_3(m_1)$, the algorithm of Table 1 produces the following five-tuple:

<Metric, a, b, c, d>=<$D_3(m_1)$, 3, 1, 1, 3>

The above process would be repeated for each of the remaining derived metrics $D_1(m_2)$, $D_2(m_2)$, $D_3(m_2)$, $D_1(m_3)$, $D_2(m_3)$, $D_3(m_3)$, ... 3, 1, 1, 3> to generate a five-tuple for each additional derived metric. To simplify this example, the processing for the remaining derived metrics will not be shown and the example will continue under the assumption that the resource monitoring system is developed as a function of only a single raw metric (and hence only the three derived metrics for which five-tuples were generated above).

Next, the algorithm set forth in Equations 8-11 may be executed to generate an instantaneous resource monitoring system. Applying Equations 8-11 to the three five-tuples generated by the processing steps illustrated in Tables 6-8 results in the following candidate instantaneous resource model:

COND=TRUE AND $D_1(m_1) \geq 10$ AND $D_2(m_1) \geq 2$ AND $D_3(m_1) \geq 1$

The designer may, at this point, choose to evaluate this model and possibly modify some of the input assumptions (such as the assigned logical values or the metrics selected) to further refine the model, or may instead choose to first develop the persistent resource monitoring system by performing the operations described below.

To construct the persistent resource monitoring system, the responsiveness, acceptable percentage of false positives and acceptable percentage of false negatives are obtained. Here, we will assume that responsiveness was specified as 11 seconds, the acceptable false positive percentage was specified as 50% and the acceptable false negative percentage was specified as 40%. Since our time samples are 2 seconds apart in this example (see Table 3 above), the responsiveness specification indicates that the results of the instantaneous resource model for at most 5 time samples may be considered before the persistent resource model makes its decision as to whether or not corrective action is required.

Next, the data in the database of derived metric values is used to determine whether or not the condition COND (i.e., the alert condition for the instantaneous resource model) is met at each time sample included in the database. As illustrated in Table 9, the condition COND is met (i.e., we have an "occurrence") at times $t_3$, $t_4$, $t_5$, $t_7$, $t_9$ and $t_{10}$. The condition COND is not met (i.e., we have a "hole") at the remaining four time samples in the historical database of derived metric values.

TABLE 9

| | Derived Metrics | | | |
|---|---|---|---|---|
| Time | $D_1(m_1)$ | $D_2(m_1)$ | $D_3(m_1)$ | COND Met? |
| $t_1$ | 4 | — | — | No |
| $t_2$ | 8 | 4 | 2 | No |
| $t_3$ | 10 | 2 | 1 | Yes |
| $t_4$ | 12 | 2 | 1 | Yes |
| $t_5$ | 18 | 6 | 3 | Yes |
| $t_6$ | 19 | 1 | 0.5 | No |
| $t_7$ | 24 | 5 | 2.5 | Yes |
| $t_8$ | 25 | 1 | 0.5 | No |
| $t_9$ | 32 | 7 | 3.5 | Yes |
| $t_{10}$ | 35 | 3 | 1.5 | Yes |

The information in Table 9 may then be used to determine the number of alerts that would be delivered by the resource monitoring system for each feasible combination of occurrence and hole settings (occ, hole) or "persistence criteria" if the information from the historical database was fed into the resource monitoring system. This may be accomplished using, for example, the exemplary techniques described above with respect to Table 2. Only the persistence criteria that are feasible given the specified responsiveness criteria need be considered. Here, the terminology (occ, holes) may be defined as (occ+holes) adjacent time samples in the database that includes at least occ number of occurrences. Thus, for example, a persistence criteria of (occ, holes)=(2, 1) is satisfied by three adjacent time samples in the database if at least two of the time samples comprise occurrences. It will be appreciated by those of skill in the art, however, that different definitions for "occurrences" and "holes" may be specified with respect to resource monitoring systems and that the methods, systems and computer program products of the present invention are not limited to any particular definition for occurrences and holes, but may be adapted to be used with any given definition.

A persistence criteria that meets the specified false negative and false positive and any responsiveness criteria may then be selected. The selected persistence criteria may then be used as the wrap-around to the instantaneous resource monitoring system to construct the persistent resource monitoring system.

Note that references are made to the user of the methods, systems and computer program products of the present invention. Herein, the term "the user" may be an end user of a particular resource that is using, for example, a Resource Monitoring System Design Wizard or to a resource monitoring system designer. Moreover, various of the inputs to the systems and computer program products of the present invention may, in some instances, be provided without direct human intervention such as by a software package that presents data that is then used in the methods, systems and computer program products of the present invention. The term "the user" is also intended to encompass such situations.

While this invention has been particularly shown and described with reference to particular embodiments thereof, it will be understood by those skilled in the art that various changes in form and details may be made therein without departing from the spirit and scope of the invention as defined by the appended claims and equivalents.

That which is claimed is:

1. A method of selecting an alert condition for a resource monitoring system, the method comprising:
associating a logic value with at least some of a plurality of entries in a database, wherein the entries in the database correspond to values for a plurality of metrics at a plurality of different times; and
selecting the alert condition based on at least some of the logic values and at least some of the entries in the database;
wherein the plurality of metrics includes at least one derived metric that is derived from at least one raw metric.

2. The method of claim 1, wherein the at least one derived metric comprises a difference between a value of a first raw metric at a first time and a value of the first raw metric at a second time.

3. The method of claim 1, wherein the at least one derived metric comprises a difference between a value of a first raw metric at a first time and a value of the first raw metric at a second time divided by the interval between the first time and the second time.

4. The method of claim 1, wherein the at least one derived metric comprises a difference between a value of a first raw metric at a first time and a value of the first raw metric at a second time divided by the difference between a value of a second raw metric at the first time and the value of the second raw metric at the second time.

5. The method of claim 1, wherein the logic values associated with entries in the database are selected based on a plurality of log entries from the resource that is to be monitored.

6. The method of claim 1, further comprising specifying an allowable rate of false positives and an allowable rate of false negatives for the resource monitoring system.

7. The method of claim 6, further comprising specifying a maximum amount of time that may elapse before an alert is generated after the occurrence of a potential alert condition.

8. The method of claim 7, further comprising using historical metric data to estimate a number of alerts that the alert condition would generate for a plurality of potential persistence criteria.

9. The method of claim 7, further comprising establishing a persistence alert condition wherein the persistence alert condition is based on the first alert condition and one of the potential persistence criteria that satisfies the specified allowable rates of false positives and of false negatives.

10. A method of selecting an alert condition for a resource monitoring system, the method comprising:
   associating a logic value with at least some of a plurality of entries in a database, wherein the entries in the database correspond to values for a plurality of metrics at a plurality of different times; and
   selecting the alert condition based on at least some of the logic values and at least some of the entries in the database;
   wherein selecting the alert condition based on at least some of the logic values and at least some of the entries in the database comprises:
   for at least one of the plurality of metrics, using the logic values and the entries in the database to determine a feasible range of values for a threshold where the threshold will have a specified relationship with respect to the metric; and
   selecting the alert condition based on the determined feasible ranges of values.

11. The method of claim 10, wherein the specified relationship is that the metric will be less than or equal to the threshold.

12. The method of claim 10, wherein the specified relationship is that the metric will be greater than or equal to the threshold.

13. The method of claim 10, wherein, for at least some of the plurality of metrics, the logic values and the entries in the database arc used to determine a first feasible range of values for a first threshold where the metric will be less than or equal to the first threshold and a second feasible range of values for a second threshold where the metric will be greater than or equal to the second threshold, and wherein the alert condition comprises the condition that, for each of the at least some of the plurality of metrics, the metric be less than or equal to the lower endpoint of any first feasible range of values and that the metric be greater than or equal to the lower endpoint of any second feasible range of values.

14. The method of claim 13, wherein a lower value and an upper value for the first feasible range for a specific metric of the at least some of the plurality of metrics are initialized, and wherein the lower value is determined by iteratively recalculating the lower value as the maximum of the pre-existing lower value and the value of a database entry for the specific metric having an associated logic value of TRUE and wherein the upper value is determined by recalculating the upper value as the minimum of the preexisting upper value and the value of a database entry for the specific metric having an associated logic value of FALSE.

15. The method of claim 13, wherein a lower value and an upper value for the second feasible range for a specific metric of the at least some of the plurality of metrics are initialized, and wherein the upper value is determined by iteratively recalculating the upper value as the minimum of the preexisting lower value and the value of a database entry for the specific metric having an associated logic value of TRUE and wherein the lower value is determined by recalculating the lower value as the maximum of the preexisting lower value and the value of a database entry for the specific metric having an associated logic value of FALSE.

16. A method of selecting an alert condition for a resource monitoring system, the method comprising:
   associating a logic value with at least some of a plurality of entries in a database, wherein the entries in the database correspond to values for a plurality of metrics at a plurality of different times; and
   selecting the alert condition based on at least some of the logic values and at least some of the entries in the database;
   wherein the plurality of metrics includes at least one raw metric.

17. A method of selecting an alert condition for a resource monitoring system, the method comprising:
   associating a logic value with at least some of a plurality of entries in a database, wherein the entries in the database correspond to values for a plurality of metrics at a plurality of different times; and
   selecting the alert condition based on at least some of the logic values and at least some of the entries in the database;
   wherein the logic values are specified using three-valued logic.

18. A method of generating a persistent resource monitoring system, the method comprising:
   providing an instantaneous resource model having an associated alert condition;
   specifying an allowable rate of false positives and an allowable rate of false negatives for the persistent resource monitoring system;
   processing a database of historical information to determine a number of times that the persistent resource monitoring system would take corrective action for a plurality of persistence criteria; and
   selecting one of the plurality of persistence criteria as a persistence requirement that is applied to the instantaneous resource model to create the persistent resource monitoring system.

19. The method of claim 18, wherein selecting one of the plurality of persistence criteria as a persistence requirement that is applied to the instantaneous resource model to create the persistent resource monitoring system comprises selecting the persistence criteria having a smallest duration that satisfies the allowable rate of false positives and the allowable rate of false negatives.

20. The method of claim 18, wherein the method further comprises specifying a maximum amount of time that may elapse before the persistent resource monitoring system issues takes corrective action after the occurrence of the alert condition associated with the instantaneous resource model, and wherein selecting one of the plurality of persistence criteria as a persistence requirement that is applied to the instantaneous resource model to create the persistent resource monitoring system comprises selecting a persistence criteria that allows corrective action to be taken within the specified time.

21. A system for selecting an alert condition for a resource monitoring system, comprising:
   means for associating a logic value with at least some of a plurality of entries in a database, wherein the entries in the database correspond to values for a plurality of metrics at a plurality of different times; and
   means for selecting the alert condition based on at least some of the logic values and at least some of the entries in the database;
   wherein the plurality of metrics includes at least one raw metric.

22. A computer program product for selecting an alert condition for a resource monitoring system, comprising:
   a computer readable medium having computer readable program code embodied therein, the computer readable program code comprising:
   computer readable program code configured to associate a logic value with at least some of a plurality of entries in a database, wherein the entries in the database correspond to values for a plurality of metrics at a plurality of different times; and computer readable program code configured to select the alert condition based on at least some of the logic values and at least some of the entries in the database;

wherein the plurality of metrics includes at least one raw metric.

23. A system for generating a persistent resource monitoring system, comprising:

means for providing an instantaneous resource model having an associated alert condition;

means for specifying an allowable rate of false positives and an allowable rate of false negatives for the persistent resource monitoring system;

means for processing a database of historical information to determine a number of times that the persistent resource monitoring system would take corrective action for a plurality of persistence criteria; and means for selecting one of the plurality of persistence criteria as a persistence requirement that is applied to the instantaneous resource model to create the persistent resource monitoring system.

24. A computer program product for generating a persistent resource monitoring system, comprising:

a computer readable medium having computer readable program code embodied therein, the computer readable program code comprising:

computer readable program code configured to provide an instantaneous resource model having an associated alert condition;

computer readable program code configured to accept input regarding an allowable rate of false positives and an allowable rate of false negatives for the persistent resource monitoring system;

computer readable program code configured to process a database of historical information to determine a number of times that the persistent resource monitoring system would take corrective action for a plurality of persistence criteria; and computer readable program code configured to select one of the plurality of persistence criteria as a persistence requirement that is applied to the instantaneous resource model to create the persistent resource monitoring system.

* * * * *